United States Patent
Wallace et al.

(10) Patent No.: US 8,293,007 B2
(45) Date of Patent: Oct. 23, 2012

(54) REMOVABLE THERMAL CONTROL FOR RIBBON CRYSTAL PULLING FURNACES

(75) Inventors: Richard Wallace, Acton, MA (US);
David Harvey, Westford, MA (US);
Weidong Huang, Acton, MA (US);
Scott Reitsma, Shrewsbury, MA (US);
Christine Richardson, Northborough, MA (US)

(73) Assignee: Max Era, Inc., Reno, NV (US)

( * ) Notice: Subject to any disclaimer, the term of this patent is extended or adjusted under 35 U.S.C. 154(b) by 1151 days.

(21) Appl. No.: 12/138,791

(22) Filed: Jun. 13, 2008

(65) Prior Publication Data

US 2008/0308035 A1 Dec. 18, 2008

Related U.S. Application Data

(60) Provisional application No. 60/944,017, filed on Jun. 14, 2007.

(51) Int. Cl.
*C30B 11/00* (2006.01)
*C30B 15/00* (2006.01)
*C30B 21/06* (2006.01)
*C30B 27/02* (2006.01)
*C30B 28/10* (2006.01)
*C30B 30/04* (2006.01)

(52) U.S. Cl. .......... 117/13; 117/11; 117/23; 117/24
(58) Field of Classification Search .......... 117/13; 149/11, 13, 23, 24
See application file for complete search history.

(56) References Cited

U.S. PATENT DOCUMENTS

| | | | |
|---|---|---|---|
| 3,265,469 A | 8/1966 | Hall | |
| 4,116,641 A | 9/1978 | Ciszek | |
| 4,118,197 A * | 10/1978 | Mackintosh et al. | 117/211 |
| 4,158,038 A | 6/1979 | Jewett | |
| 4,235,848 A | 11/1980 | Sokolov et al. | |
| 4,356,152 A * | 10/1982 | Berkman et al. | 117/211 |
| 5,098,675 A | 3/1992 | Matsuo et al. | |
| 2004/0083946 A1 * | 5/2004 | Wallace, Jr. | 117/16 |
| 2004/0139910 A1 | 7/2004 | Sachs | |
| 2008/0134964 A1 * | 6/2008 | Harvey et al. | 117/211 |
| 2010/0288186 A1 | 11/2010 | Bang | |

FOREIGN PATENT DOCUMENTS

| | | |
|---|---|---|
| JP | 54128988 A | 10/1979 |
| JP | 09175892 A | 7/1997 |
| WO | 2004035877 A2 | 4/2004 |

OTHER PUBLICATIONS

Search Report and Written Opinion—Application No. 200908133 dated Mar. 21, 2011 (12 pages).
International Search Report dated Jun. 8, 2008.
Office Action for related U.S. Appl. No. 12/542,131 dated Jul. 6, 2012, pp. 1-12.
Final Rejection for related U.S. Appl. No. 12/138,799 dated Jul. 12, 2012, pp. 1-9.

* cited by examiner

*Primary Examiner* — James McDonough
(74) *Attorney, Agent, or Firm* — Ditthavong Mori & Steiner, P.C.

(57) ABSTRACT

A ribbon crystal pulling furnace has a base insulation and a liner insulation removably connected to the base insulation. At least a portion of the liner insulation forms an interior for containing a crucible.

7 Claims, 7 Drawing Sheets

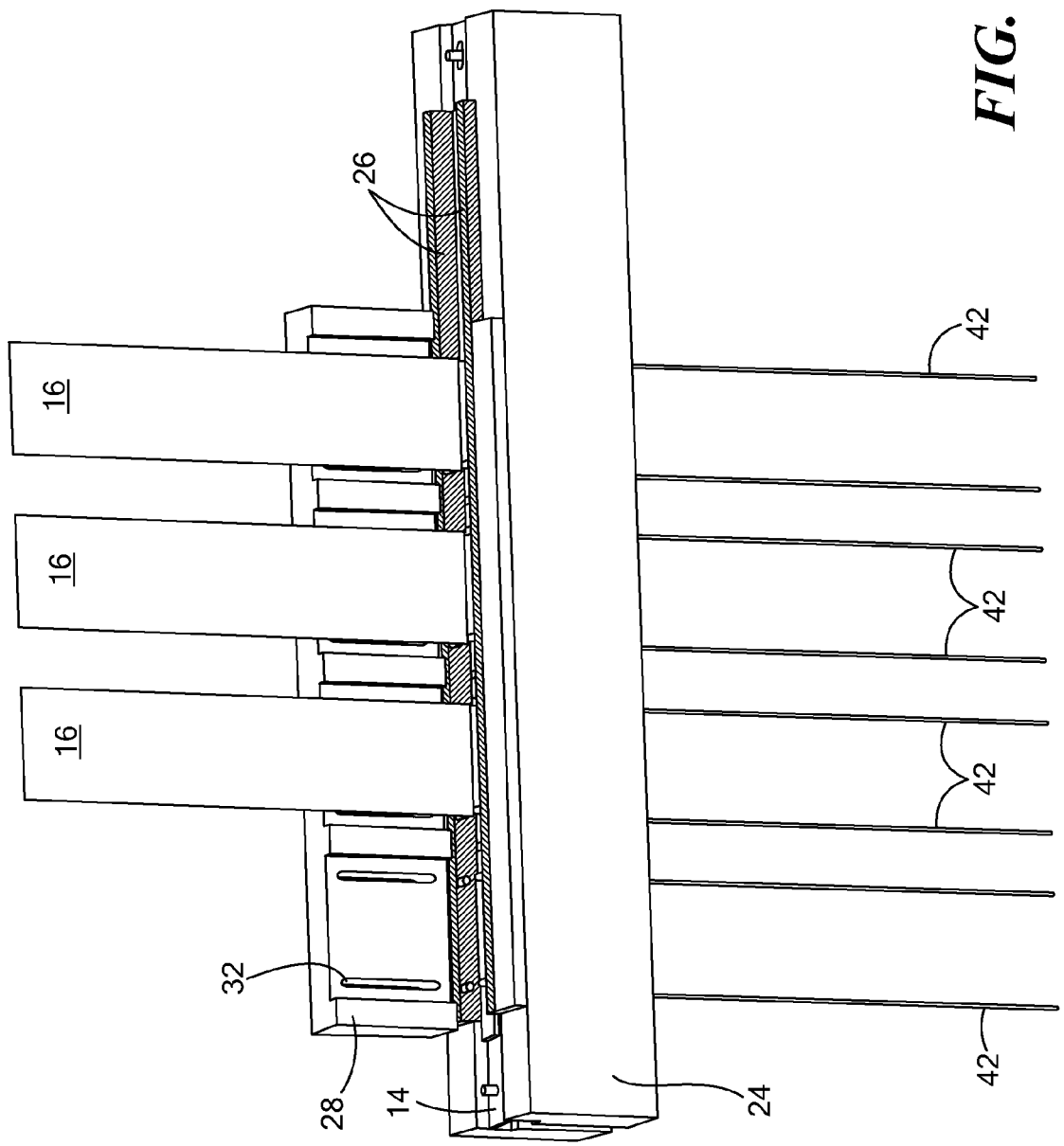

REMOVABLE THERMAL CONTROL FOR RIBBON CRYSTAL PULLING FURNACES

CROSS-REFERENCE TO RELATED APPLICATIONS

This patent application claims priority to U.S. Provisional Patent Application No. 60/944,017 filed Jun. 14, 2007, entitled THERMAL CONTROL FOR RIBBON CRYSTAL PULLING FURNACES, the disclosure of which is incorporated by reference herein in its entirety. This patent application is also related to U.S. patent application entitled RIBBON CRYSTAL PULLING FURNACE AFTERHEATER WITH AT LEAST ONE OPENING, which is being filed on the same date herewith and is incorporated by reference herein in its entirety.

FIELD OF THE INVENTION

The invention generally relates to ribbon crystal pulling furnaces and, more particularly, the invention relates to removable insulation within ribbon crystal pulling furnaces.

BACKGROUND OF THE INVENTION

Silicon wafers are the building blocks of a wide variety of semiconductor devices, such as solar cells, integrated circuits, and MEMS devices. For example, Evergreen Solar, Inc. of Marlboro, Mass. forms solar cells from silicon wafers fabricated by means of the well known "ribbon pulling" technique.

The ribbon pulling technique generally uses a specialized furnace that surrounds a crucible containing molten silicon and a growing ribbon crystal. The base of the furnace is typically formed from a solid, insulating material. Over time, this insulating material may become contaminated with the molten silicon splashing on it, or become damaged in some way, e.g., pieces of the material flaking off and falling into the melt. Unfortunately, this insulating material is typically expensive to replace and may cause undue downtime to repair or replace.

SUMMARY OF THE INVENTION

In accordance with one embodiment of the invention, a ribbon crystal pulling furnace has a base insulation and a liner insulation removably connected to the base insulation. At least a portion of the liner insulation forms an interior for containing a crucible. Accordingly, the liner insulation may be disposable, while the base insulation may be reusable (with different liner insulations removably attached).

In related embodiments, the liner insulation may be graphite or a carbon foam material. The base insulation may be a ceramic material. The base insulation may be formed from a material that is chemically and structurally different than that of the liner insulation. Alternatively, the base insulation may be formed from the same or similar material as the liner insulation. The furnace may also include a crucible and at least a portion of the liner insulation may be positioned adjacent to the crucible and/or be positioned beneath the crucible. The furnace may also include an afterheater positioned above the base insulation and the liner insulation. The afterheater may be supported by the base insulation.

In accordance with another embodiment of the invention, a ribbon crystal growth method provides a base insulation and removably connects a liner insulation to the base insulation. At least a portion of the liner insulation forms an interior for containing a crucible. In related embodiments, the method also provides a crucible. At least a portion of the liner insulation may be positioned adjacent to and/or beneath the crucible.

In accordance with another embodiment of the invention, a method of growing a ribbon crystal provides a furnace having a crucible with a plurality of string holes. The furnace also has a base insulation with a first removably connected liner. The method also adds molten material to the crucible and passes string through the string holes and the molten material to grow a ribbon crystal. In related embodiments, the method also removes the first liner and removably connects a second liner to the base insulation.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIG. 5 schematically shows a perspective view of a ribbon crystal growth furnace with the housing removed according to embodiments of the present invention;

DESCRIPTION OF ILLUSTRATIVE EMBODIMENTS

In illustrative embodiments, a ribbon crystal pulling furnace may include a base insulation that supports a high purity, relatively easily replaceable liner insulation. The liner insulation is adjacent to a crucible capable of containing molten silicon. The liner insulation is made of a material that is able to withstand relatively high temperatures. When necessary, the liner insulation may be replaced, (e.g., due to damage or contamination) and thus, is removably attached to the base insulation. The liner insulation is removable connected since it can be easily removed without substantially and permanently altering the overall structure of the base insulation. Accordingly, during anticipated use, removal of the liner insulation should not substantially damage the base insulation. Details of illustrative embodiments are discussed below.

Figure 1:
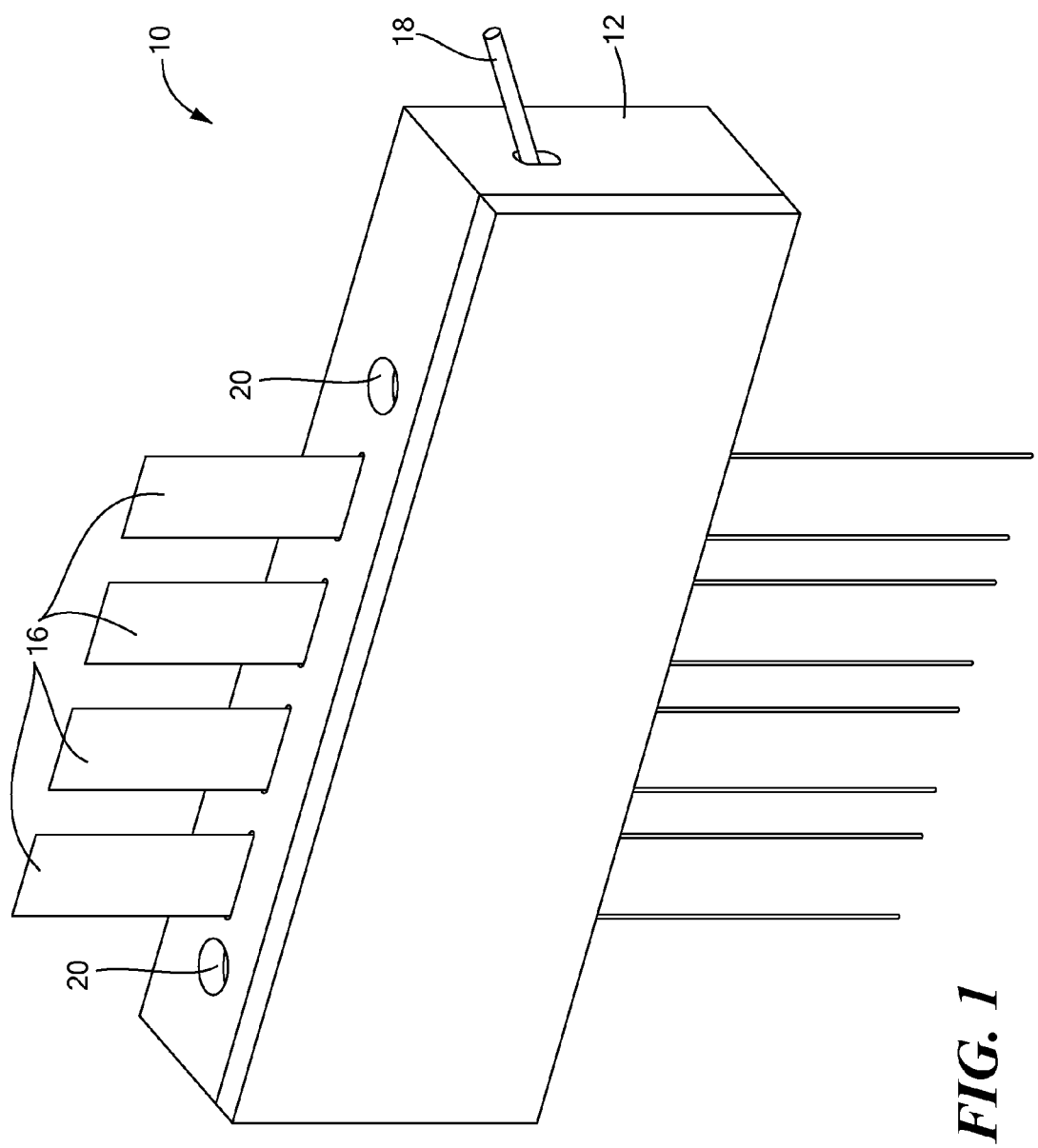
FIG. 1 schematically shows a silicon ribbon crystal growth furnace that may implement illustrative embodiments of the invention.

FIG. 1 schematically shows a silicon ribbon crystal pulling furnace 10 that may implement illustrative embodiments of the present invention. The furnace 10 includes a housing 12 forming an enclosed or sealed interior that is substantially free of oxygen (e.g., to prevent combustion). Instead of oxygen, the interior may have some concentration of another gas, such as argon or other inert gas, or a combination of gasses. The interior includes a crucible 14 (as shown in FIGS. 2-6) and other components (some of which are discussed below) for substantially simultaneously growing a plurality of silicon ribbon crystals 16. Although FIG. 1 shows four silicon ribbon crystals, the furnace 10 may substantially simultaneously grow more or fewer of the ribbon crystals. The ribbon crystals 16 may be single crystalline, polycrystalline, or multi-crystalline silicon. A feed inlet 18 in the housing 12 provides a means for directing silicon feedstock into the interior of the housing 12 to the crucible 14, while one or more optional windows 20 permit inspection of the interior and its components.

It should be noted that discussion of the silicon ribbon crystals 16 is illustrative and not intended to limit all embodiments of the invention. For example, the ribbon crystals 16 may be formed from other materials, or a combination of silicon and some other material.

Figure 2:
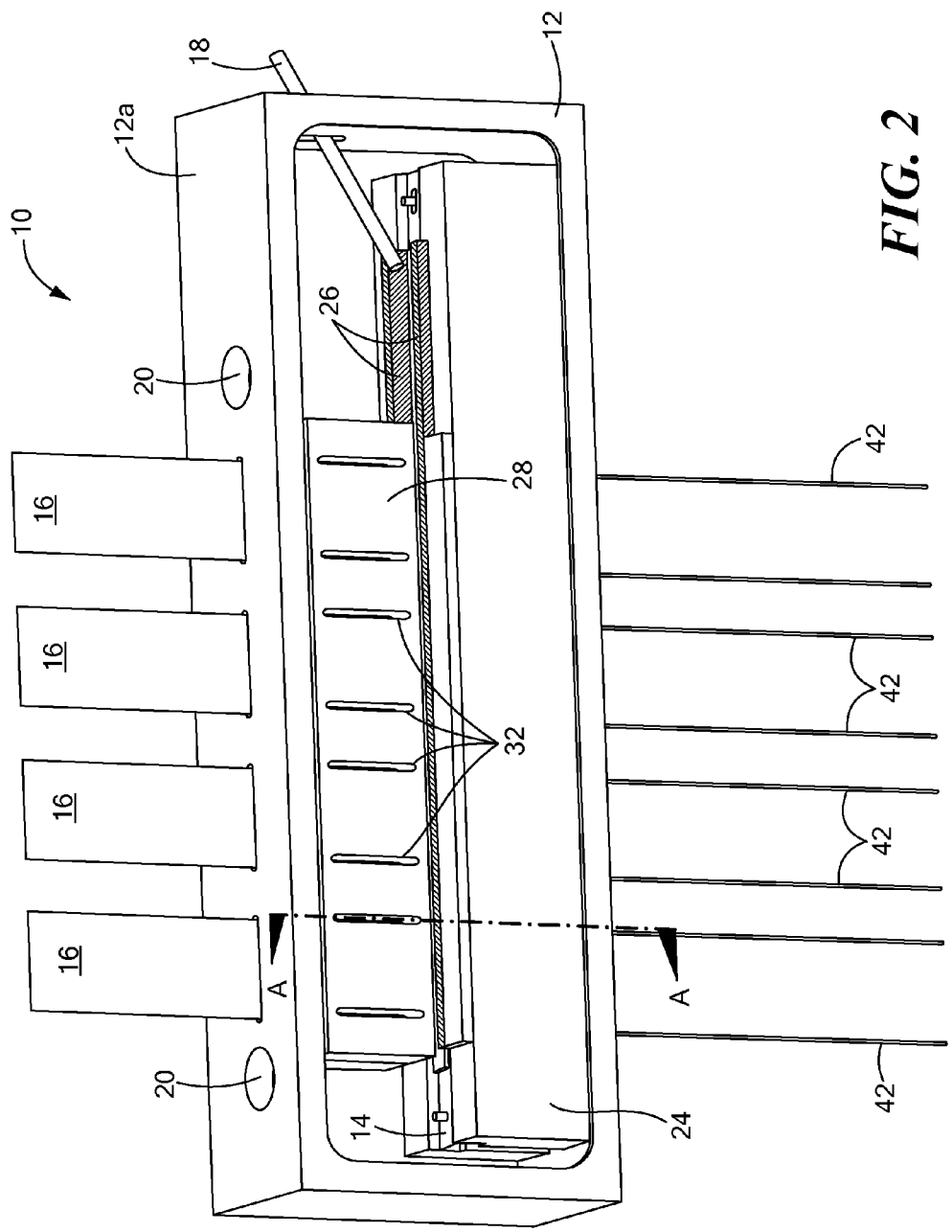
FIG. 2 schematically shows a partially cut away view of the ribbon crystal growth furnace shown in FIG. 1 with part of the housing removed.

FIG. 2 schematically shows a partially cut away view of the furnace 10 shown in FIG. 1 with a part of the housing 12 removed. This view shows, among other things, the above noted crucible 14, which has a substantially flat top surface that may support or contain a molten material. This embodiment of the crucible 14 has an elongated shape with a region for growing ribbon crystals 16 in a side-by-side arrangement along its length.

The furnace 10 has insulation that is specially configured based upon the thermal requirements of the various regions in the furnace 10, e.g., the region containing the molten material and the region containing the resulting growing ribbon crystal. Both of these regions essentially form an interior area through which the growing ribbon crystals 16 pass. Accordingly, the interior of the furnace 10 includes a base insulation 24 and a liner insulation 26 that together form an area containing the crucible 14, as discussed in more detail below. The furnace also includes an afterheater 28 positioned above the base insulation 24 and liner insulation 26 (from the perspective of the drawings). The afterheater 28 provides a controlled thermal environment for permitting the growing ribbon crystal 16 to cool as it rises from the crucible 14. The base insulation 24, liner insulation 26, and afterheater 26 may have related but different thermal requirements and thus, may be made from different materials. Alternative embodiments, however, may have similar or the same insulation material in the various regions.

Figure 3:
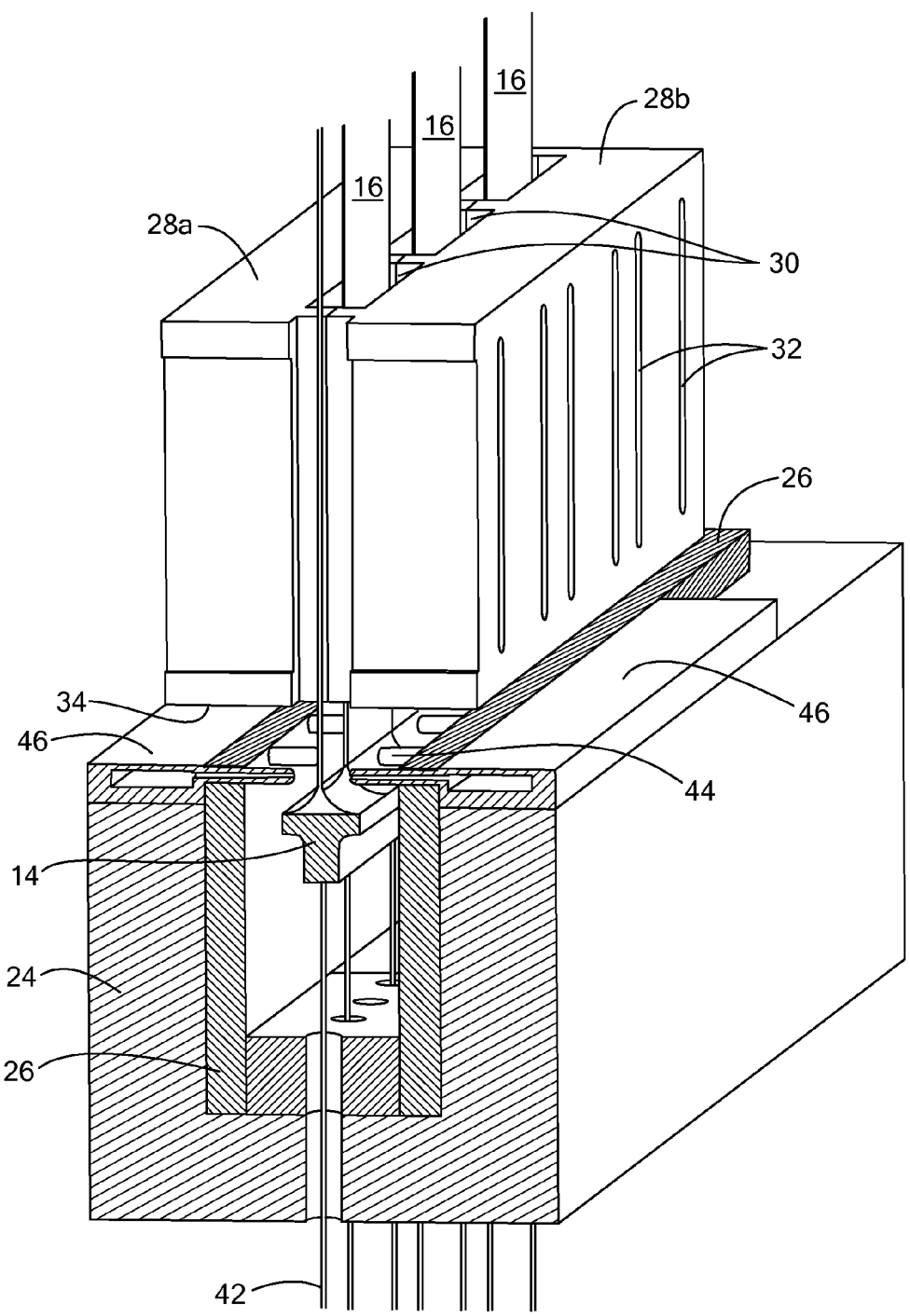
FIG. 3 schematically shows a perspective cross-sectional view along line A-A of FIG. 2 with the housing removed according to embodiments of the present invention.
Figure 4:
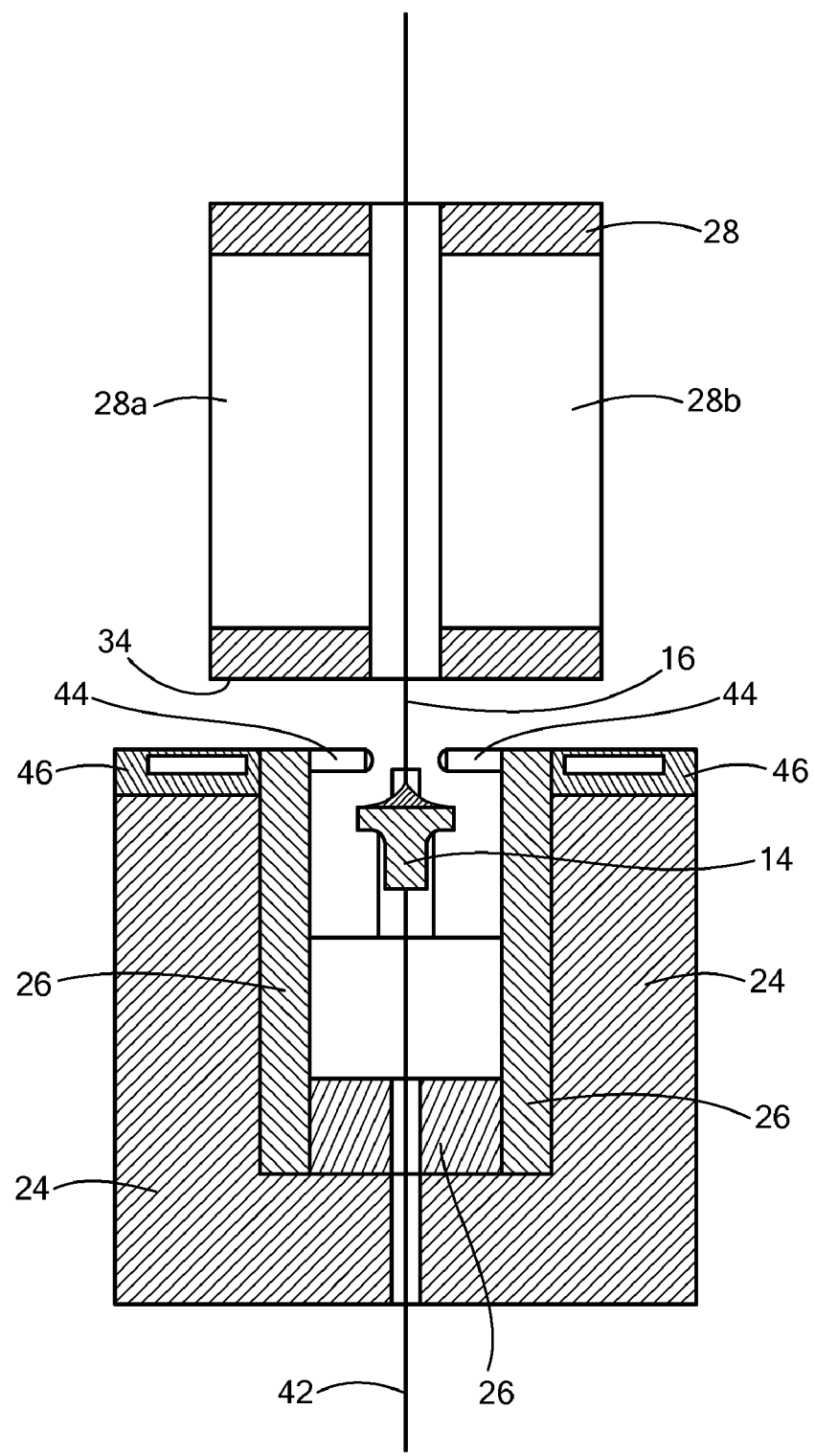
FIG. 4 schematically shows a cross-sectional view along line A-A of FIG. 2 with the housing removed according to embodiments of the present invention.

FIGS. 3 and 4 schematically show a perspective cross-sectional view and cross-sectional view, respectively, along line A-A of FIG. 2 with the housing removed. As shown in FIGS. 2-4, the afterheater 28 is generally vertically spaced above the base insulation 24 and the liner insulation 26. The afterheater 28 may be supported by one or both of the base insulation 24 and the liner insulation 26, e.g., by posts (not shown). In addition, or alternatively, the afterheater 28 may be attached or secured to a top portion 12a of the housing 12. In some embodiments, the afterheater 28 has two portions, 28a, 28b, which are positioned on either side of the growing ribbon crystals 16. The two portions 28a, 28b form one or more channels 30 (as shown in FIG. 3) through which the ribbon crystal grows. Alternatively, the afterheater 28 may also be positioned on only one side of the growing ribbon crystals 16, as shown in FIG. 5.

The afterheater 28 may be formed from any insulation material that provides the appropriate thermal requirements for allowing the ribbon crystal to cool in a controlled manner. For example, the afterheater 28 may be formed from a graphite or carbon material, such as carbon foam or graphite foam insulation material. Thus, the afterheater 28 may be formed from a material similar to the liner insulation 26, as discussed in further detail below. Despite that, the thermal requirements in the region formed by the afterheater 26 generally are different from the thermal requirements in the region that includes the crucible 14 and molten material.

Figure 6A:
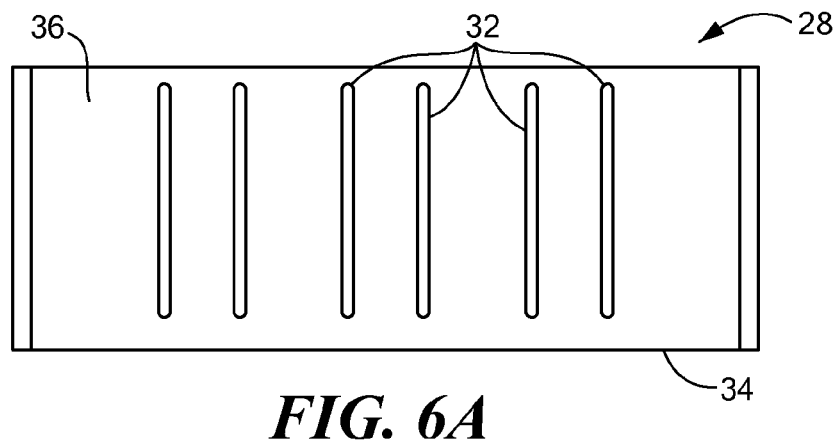
FIGS. 6A & 6B schematically show a side view and a perspective bottom view, respectively, of the afterheater insulation according to embodiments of the present invention.
Figure 6B:
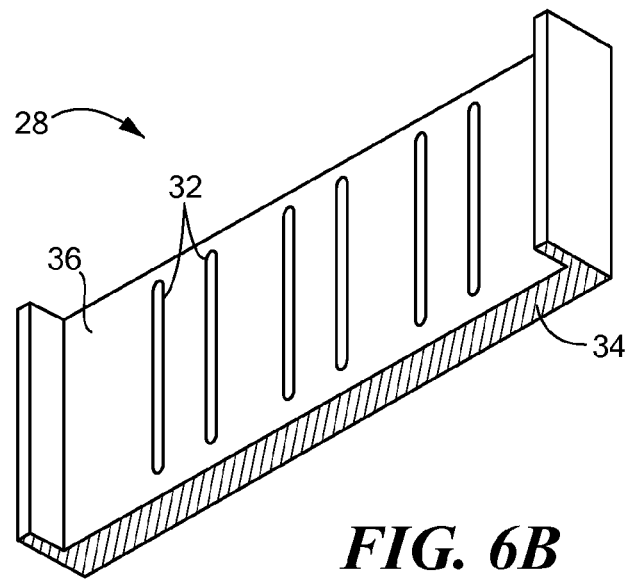

In illustrative embodiments, the afterheater 28 has one or more openings 32 for controllably venting heat from the growing ribbon crystals 16 that pass through the channel 30. FIGS. 6A and 6B show one embodiment of such an afterheater 28. In this embodiment, the afterheater 28 has a bottom 34 that faces the base insulation 24 and liner insulation 26, and at least one vertically extending wall 36 having the openings 32.

Figure 7:
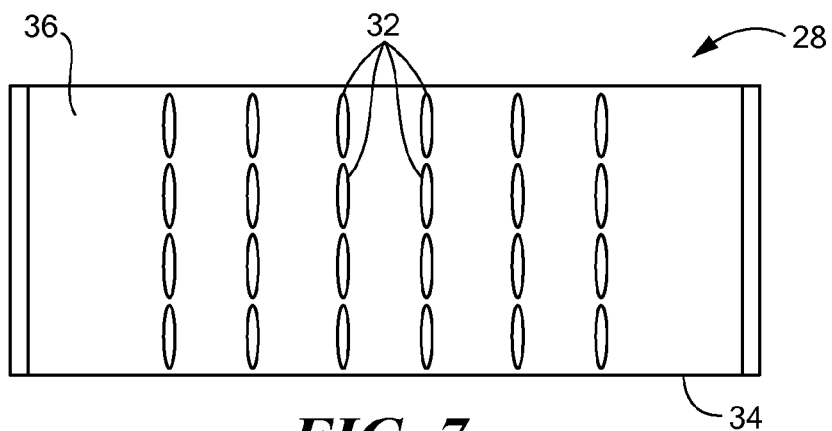
FIG. 7 schematically shows a side view of the afterheater insulation according to another embodiment of the present invention.

In the embodiment shown, the openings 32 are in the form of elongated slots that each have substantially uniform width. Alternatively, the slots may have varying widths. In other embodiments, the openings 32 may have different shapes either uniform or varying, such as round shapes, rectangular shapes, or irregular shapes. The openings 32 may be positioned adjacent to one another, with the opening extending the length of the wall 36 in the vertical direction, as shown in FIG. 6A. Alternatively, the openings 32 may be vertically aligned on top of one another, as shown in FIG. 7. The desired thermal characteristics of the growing crystal ribbon region, as well as the material composition and thickness of the afterheater 28, factor into the total amount of area of the openings 32 and/or their configuration.

The size and shape of the openings 32 may be varied depending on the desired thickness of the ribbon crystals 16. However, in general, the size and shape should not be too large because the ribbon crystal 16 may become too thick at certain areas, and/or have undesirable internal strains or stresses. The size and shape of the openings 32 thus should be carefully controlled to minimize such strains or stresses, and ensure appropriate ribbon crystal thickness.

The openings 32 preferably extend completely through the wall 36 of the afterheater 28. In alternative embodiments, however, the openings 32 simply may be thinner regions of the afterheater 28. The wall 36 of the afterheater 28 may having varying thicknesses, such as shown in FIGS. 3 and 5, as well as the openings 32 extending completely through the wall 36.

Figure 8:
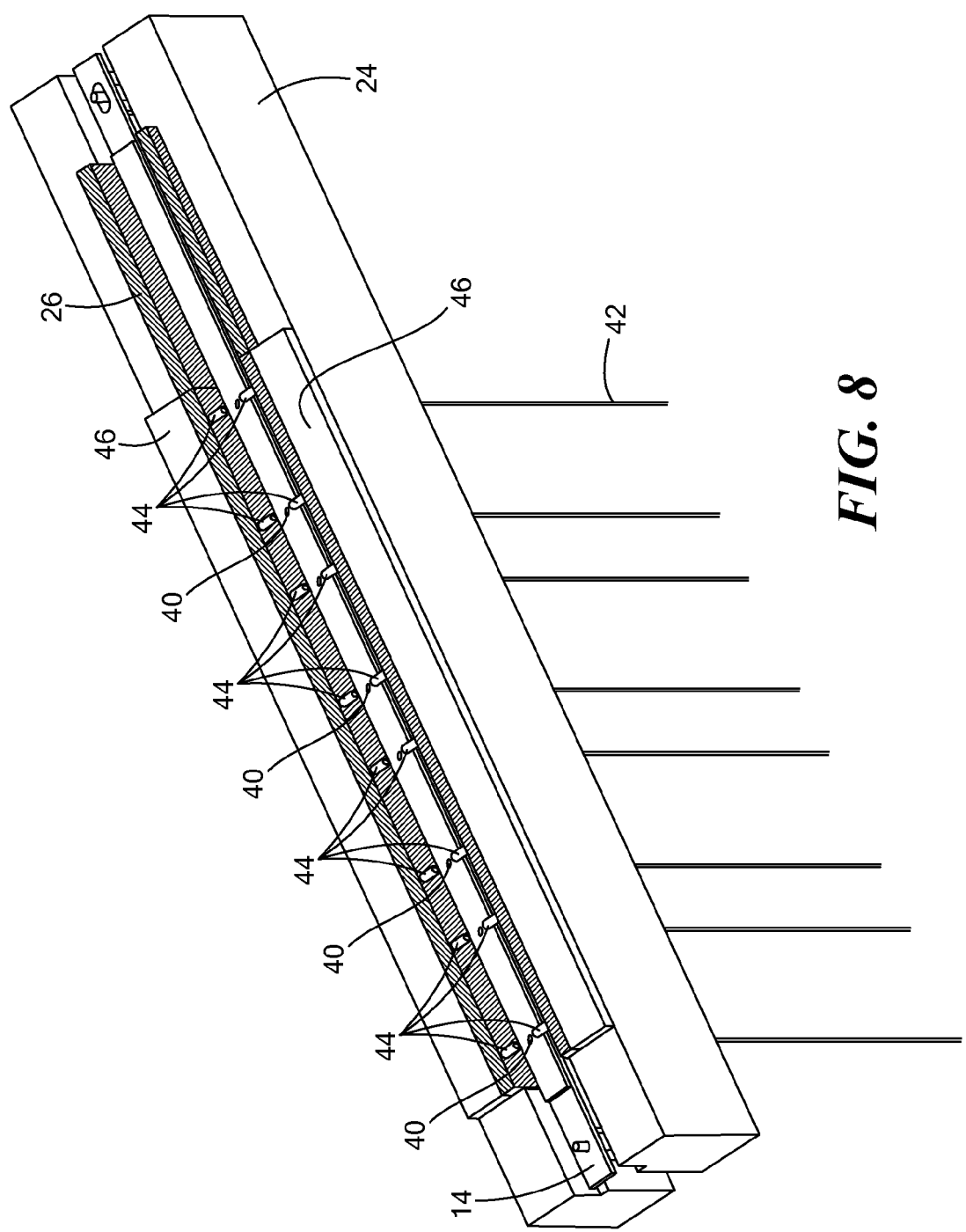
FIG. 8 schematically shows a perspective top view of the base insulation and liner insulation without the afterheater insulation.

The openings 32 illustratively are positioned at specified locations to control certain characteristics and qualities of the growing ribbon crystals 16. For example, the crucible 14 may have a plurality of string holes 40 (see FIG. 8) for receiving string 42. As the string 42 passes through the crucible 14, molten silicon freezes to its surface, thus forming the growing ribbon crystal 16. Undesirably, there may be portions of the growing ribbon crystal 16 that, absent some further cooling, may be thinner than intended (e.g., forming thin, fragile "neck regions"). Accordingly, the openings 32 may be positioned near those sections of the growing ribbon crystal 16 to ensure appropriate cooling and thus, the desired thickness.

For example, two string holes may be considered as forming a plane extending vertically upwardly through the furnace 10 along the ribbon crystal growth direction. As shown in FIG. 2, a ribbon crystal 16 grows generally parallel to this plane. The openings 32 may be positioned or aligned along the edge of this plane or the growing ribbon crystal 16, as shown in FIGS. 2 and 5, or may be positioned anywhere along this vertically extending plane, thus reducing the temperature in that region of the furnace 10. Reducing the temperature in that region should have the effect of increasing the ribbon crystal thickness in the corresponding area.

As the string 42 passes through the crucible 14, molten silicon within the crucible 14 may inadvertently splash onto the liner insulation 26. In addition, the liner insulation 26 may become damaged or contaminated when an operator manually cleans the furnace 10. This may cause the insulation 26 to have a different, relatively unpredictable thermal effect on that region of the furnace 10. Also, during actual use, portions of the insulation adjacent to the melt may flake off into the crucible 14, thus mixing with silicon melt as known by those skilled in the art. Accordingly, it is desirable to ensure that these flakes have no greater than a negligible impact on the chemical composition of the silicon melt and, ultimately, the growing ribbon crystal.

To that end, the liner insulation 26 preferably is formed from a very pure, high quality material that is able with stand relatively high temperatures. For example, the liner insulation material preferably operates in temperatures ranging from about 1000° C. to about 1500° C. To those ends, the liner insulation 26 may be formed from a variety of materials (e.g., graphite, silicon carbide, quartz, or aluminum oxide) having various physical structures, such as a low density, high thermal conductivity material (e.g., carbon foam, carbon fiber or graphite foam materials). Acceptable liner insulation materials are commercially available from Fiber Materials, Inc. of Biddeford, Me. or Graphtek, LLC of Buffalo Grove, Ill.

In illustrative embodiments, the base insulation 24 may be formed from a less pure, less expensive material than the liner insulation 26. Since the base insulation 26 is separated from the high temperature molten material by the liner insulation 26, the base insulation material 24 is not required to with stand the high temperatures that the liner insulation 26 must withstand. For example, the base insulation material may operate at temperatures ranging from about room temperature to about 1000° C. The base insulation 24 thus may be formed from a variety of materials meeting those requirements, such as a ceramic material (e.g., aluminum oxide or silicon dioxide). In contrast, the liner insulation 26 is formed from a material that can withstand higher temperatures. To that end, the liner insulation 26 may be formed from a different material (chemically and/or structurally) than that of the base insulation 30. For example, the base insulation 24 may be formed from a solid, relatively dense graphite plate, while the liner insulation 26 may be formed from a graphite or carbon foam material. In other embodiments, the base insulation 24 and the liner insulation 26 may be formed from the same or similar materials.

As shown more clearly in FIGS. 3 and 4, the liner insulation 26 is positioned vertically along the sidewalls of the base insulation 24 (i.e., adjacent to the crucible 14) and may also be underneath the crucible 14. As such, the liner insulation 26 effectively forms an interior for partly containing the crucible 14. In some embodiments, the furnace 10 may include a gas system having gas jets 44 coupled to a gas manifold 46 to further cool the growing ribbon crystal. For example, as shown in FIGS. 3 and 4, the liner insulation 26 may include openings that permit the gas jets 44 into the interior area adjacent to the crucible 14, while protecting the gas manifold 46 from being significantly contaminated with the molten material.

The thickness of the liner insulation 26 may vary depending on a number of factors, including the insulative properties of the liner insulation 26 and the base insulation 24, as well as the desired operating temperatures of the furnace 10. However, in one embodiment, the liner insulation 26 may be thinner than the base insulation 24 to reduce the cost of replacing the very pure, high quality material, which is typically expensive.

The liner insulation 26 is expected to be subjected to a number of environmental factors that ultimately can reduce its efficiency and thus, may be considered as having a certain lifespan. As noted above, molten silicon splashed onto its walls, as well as normal flaking, may impact liner insulation effectiveness. Accordingly, at some point, those skilled in the art may choose to replace the liner insulation 26. To that end, the liner insulation 26 may be removed from its connection with the base insulation 24 and subsequently discarded. New liner insulation 26 may be removably connected to the base insulation 24, enabling the furnace 10 to return to its more efficient operation mode (i.e., with new liner insulation 26 that is substantially free of the above noted problems).

As mentioned above, in illustrative embodiments of the invention, the liner insulation 26 is removably connected to the base insulation 24. Any number of techniques may be used to removably connect the liner insulation 26 to the base insulation 24. For example, a plurality of screws (not shown) may fasten the liner insulation 26 to the base insulation 24. Other techniques may be used, however, including a snap-fit mechanism.

Various embodiments of the invention may be combined. For example, the afterheater 28 may be removably connected to the base 24 or liner insulation 26 and thus, also relatively easily replaced. In addition, the base insulation 24 may have openings 32 that effectively act as vents for heat in the region adjacent to the crucible 14. Accordingly, the generally separate discussion of each of these aspects of the different embodiments is not intended to limit all embodiments.

Accordingly, various embodiments of the invention permit insulation within the furnace 10 to be replaced as needed without changing the basic furnace structure. In addition, other embodiments enable greater control of the thermal profile within the furnace 10 by having openings 32 in the afterheater 28 or the base insulation 24. These openings 32 effectively serve as heat vents.

Although the above discussion discloses various exemplary embodiments of the invention, it should be apparent that those skilled in the art can make various modifications that will achieve some of the advantages of the invention without departing from the true scope of the invention.

What is claimed is:

1. A method of growing a ribbon crystal, the method comprising:
    providing a furnace having a crucible with a plurality of string holes, the furnace also having a base insulation with a first removably connected liner insulation;
    adding molten material to the crucible; and
    passing string through the string holes and the molten material to grow a ribbon crystal.

2. The method as defined by claim 1 further comprising:
    removing the first liner insulation; and removably connecting a second liner insulation to the base insulation.

3. The method as defined by claim 1, wherein the liner insulation comprises graphite or a carbon foam material.

4. The method as defined by claim 1, wherein the base insulation comprises a ceramic material.

5. The method as defined by claim 1, wherein the base insulation is formed from the same material as the liner insulation.

6. The method as defined by claim 1, wherein at least a portion of the liner insulation is positioned adjacent to the crucible.

7. The method as defined by claim 1, wherein at least a portion of the liner insulation is positioned beneath the crucible.

* * * * *